US012707809B2

(12) United States Patent
Kim et al.

(10) Patent No.: US 12,707,809 B2
(45) Date of Patent: Aug. 11, 2026

(54) DISPLAY DEVICE

(71) Applicant: Samsung Display Co., LTD., Yongin-si (KR)

(72) Inventors: Sun Ho Kim, Seongnam-si (KR); Hyun Kim, Seoul (KR); Ju Chan Park, Seoul (KR); Sun Hee Lee, Hwaseong-si (KR); Seon Beom Ji, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 181 days.

(21) Appl. No.: 16/705,489

(22) Filed: Dec. 6, 2019

(65) Prior Publication Data

US 2020/0243781 A1 Jul. 30, 2020

(30) Foreign Application Priority Data

Jan. 30, 2019 (KR) ........................ 10-2019-0011860

(51) Int. Cl.
*H10K 59/121* (2023.01)
*H10K 77/10* (2023.01)
(Continued)

(52) U.S. Cl.
CPC ......... *H10K 59/121* (2023.02); *H10K 77/111* (2023.02); *H10K 59/131* (2023.02); *H10K 59/8731* (2023.02); *H10K 2102/311* (2023.02)

(58) Field of Classification Search
CPC ............. H01L 51/0097; H01L 51/5012; H01L 2251/5338; G09F 9/301; H10K 2102/311;
(Continued)

(56) References Cited

U.S. PATENT DOCUMENTS 9,825,108 B2 11/2017 Kim et al.
10,211,276 B2 2/2019 Choi et al.
(Continued)

FOREIGN PATENT DOCUMENTS

CN 106449698 A 2/2017
CN 107204154 A 9/2017
(Continued)

OTHER PUBLICATIONS

Machine translation of KR-20190027986-A. (Year: 2019).*
European Search Report for European Patent Application No. 20153896.4 dated Jun. 5, 2020.

*Primary Examiner* — Jessica S Manno
*Assistant Examiner* — Andrew Chung
(74) *Attorney, Agent, or Firm* — CANTOR COLBURN LLP

(57) ABSTRACT

A display device includes a flat area, and a first bending area at which the display device is bendable, the first bending area including in order in a direction away from the flat area, a first upper bending portion, a first extending portion, and a first lower bending portion, a light-emitting element including an emission layer in the flat area and in the first upper bending portion and with which an image is displayable in both the flat area and the first upper bending portion, and an inorganic layer in the flat area and the in the first bending area. A thickness of the inorganic layer in each of the first upper bending portion, the first extending portion and the first lower bending portion of the first bending area is smaller than a thickness of the inorganic layer in the flat area.

20 Claims, 7 Drawing Sheets

(51) Int. Cl.
*H10K 59/131* (2023.01)
*H10K 59/80* (2023.01)
*H10K 102/00* (2023.01)

(58) Field of Classification Search
CPC .. H10K 77/111; H10K 59/121; H10K 59/131; H10K 59/8731
See application file for complete search history.

(56) References Cited

U.S. PATENT DOCUMENTS 10,230,062 B2 3/2019 Kim et al.
10,256,284 B2 4/2019 Choi et al.
10,374,191 B2 8/2019 Jung et al.
10,483,291 B2 11/2019 Kwak et al.
10,658,628 B2 5/2020 Lee et al.
10,892,441 B2 1/2021 Jung et al.
11,158,655 B2 10/2021 Kwak et al.
11,251,412 B2 2/2022 Lee et al.
11,672,139 B2 6/2023 Jung et al.
2014/0307395 A1* 10/2014 An .................... G06F 1/1652 361/749
2014/0361262 A1* 12/2014 Kim .................... G09G 3/035 257/40
2015/0001483 A1 1/2015 Namkung et al.
2016/0218305 A1* 7/2016 Kim .................... G02F 1/133345
2017/0047357 A1 2/2017 Kwak et al.
2017/0062537 A1 3/2017 Kim et al.
2017/0170206 A1 6/2017 Lee et al.
2017/0222184 A1 8/2017 Park
2017/0262109 A1* 9/2017 Choi .................... H10D 86/411
2017/0331058 A1 11/2017 Seo et al.
2018/0013080 A1 1/2018 Kim et al.
2018/0083211 A1 3/2018 Lee et al.
2018/0247985 A1 8/2018 Jeon et al.
2018/0329552 A1* 11/2018 Song .................... G06F 3/044
2019/0074331 A1* 3/2019 Oh .................... H01L 51/5209
2019/0148474 A1* 5/2019 Bu .................... H01L 27/3276 257/40
2019/0157312 A1 5/2019 Lee et al.
2019/0372035 A1* 12/2019 Yoshida .................... B32B 7/04
2021/0057500 A1* 2/2021 Saitoh .................... H10K 59/124
2021/0336164 A1* 10/2021 Bu .................... H10K 59/873
2022/0045108 A1 2/2022 Kwak et al.
2022/0149131 A1 5/2022 Lee et al.
2023/0284474 A1 9/2023 Jung et al.

FOREIGN PATENT DOCUMENTS

CN 107591089 A 1/2018
CN 108933162 A 12/2018
CN 109216412 A 1/2019
EP 3182473 A1 6/2017
KR 20170024657 A 3/2017
KR 1020170044167 A 4/2017
KR 101796812 B1 11/2017
KR 1020180014403 A 2/2018
KR 1020180027704 A 3/2018
KR 20180032731 A 4/2018
KR 20180051318 A 5/2018
KR 101866300 B1 6/2018
KR 20180130613 A 12/2018
KR 20190027986 A * 3/2019 ......... H01L 27/3248

* cited by examiner

DISPLAY DEVICE

This application claims priority to Korean Patent Application No. 10-2019-0011860 filed on Jan. 30, 2019, and all the benefits accruing therefrom under 35 U.S.C. § 119, the entire contents of which are incorporated herein by reference.

BACKGROUND

(a) Field

The present disclosure relates to a display device, and in detail, relates to a flexible display device including a flat area and a bending area adjacent thereto.

(b) Description of the Related Art

A display device includes a display panel that displays an image through a pixel array on a substrate. By bending at least a portion of the display device, a peripheral area that does not display the image may be reduced.

SUMMARY

Exemplary embodiments provide a flexible display device reducing or effectively preventing defects such as a crack, wiring damage, etc., and having improved display quality by reducing a thickness of an inorganic layer in the bending area of the display device to reduce the stress applied to the bending area.

A display device includes a substrate including a flat area at which an image is displayable, and a first bending area at which an image is displayable and at which the display device is bendable, the first bending area extended from a first side of the flat area and including in order in a direction away from the flat area, a first upper bending portion, a first extending portion, and a first lower bending portion, a transistor disposed in the flat area, a light-emitting element electrically connected to the transistor, the light-emitting element including an emission layer in the flat area and in the first upper bending portion and with which an image is displayable in both the flat area and the first upper bending portion, and an inorganic layer disposed in the flat area and the in the first bending area. A thickness of the inorganic layer disposed in each of the first upper bending portion, the first extending portion and the first lower bending portion of the first bending area is smaller than a thickness of the inorganic layer disposed in the flat area.

The inorganic layer may include a barrier layer, a buffer layer, a first insulating layer or a second insulating layer.

In the flat area may include each of the first insulating layer, the second insulating layer, the barrier layer and the buffer layer, on the substrate, and each of the first insulating layer and the second insulating layer in the flat area may extend from the flat area to be disposed in the first lower bending portion.

The transistor may include a semiconductor layer, a gate electrode disposed on the semiconductor layer, a source electrode electrically connected to the gate electrode, and a drain electrode electrically connected to the gate electrode.

A gate conductor may include the gate electrode, a data conductor may include the source electrode and the drain electrode, and in order from the substrate may be disposed the buffer layer, the semiconductor layer, the first insulating layer, the gate conductor, the second insulating layer and the data conductor.

In the first bending area, the barrier layer and the buffer layer of the inorganic layer may include a first opening.

In the first lower bending portion, the first insulating layer and the second insulating layer of the inorganic layer may include a second opening aligned with the first opening at the first lower bending portion.

The display device may further include in the first lower bending portion, a protection layer including an organic material. The protection layer may extend into the first opening and the second opening to fill the first opening and the second opening.

The emission layer may include a first emission layer in the flat area and with which the image is displayed in the flat area, a bending emission layer in the first upper bending portion and with which the image is displayed in the first upper bending portion. The substrate which is bent at the first bending area may bend the bending emission layer together with the first upper bending portion.

A sum of thicknesses of the barrier layer and the buffer layer may be in a range of about 7,000 angstroms (Å) to about 12,000 Å.

The first bending area may be bent under the flat area based on a side of the adjacent flat area.

The first upper bending portion, the first extending portion, and the first lower bending portion disposed in order in the direction away from the flat area may respectively meet each other at sides adjacent to each other, and the substrate which is bent may bend the first bending area at each of the adjacent sides at which the first upper bending portion, the first extending portion and the first lower bending portion respectively meet.

The display device may further include a second bending area extended from a second side of the flat area opposite to the first side thereof and at which the display device is bendable, a third bending area extended from a third side of the flat area and at which the display device is bendable, or a fourth bending area extended from a fourth side of the flat area opposite to the third side thereof and at which the display device is bendable.

The substrate which is respectively bent at the second bending area, the third bending area or the fourth bending area may dispose the second bending area, the third bending area or the fourth bending area under the flat area.

The emission layer may include a first emission layer in the flat area and with which the image is displayed in the flat area, and a bending emission layer in the second bending area, the third bending area and the fourth bending area and with which the image is respectively displayed the second bending area, the third bending area, and the fourth bending area. The substrate which is respectively bent at the second bending area, the third bending area or the fourth bending area may bend the bending emission layer.

The light-emitting element may include a first electrode and a second electrode facing each other, and the first emission layer between the first electrode and the second electrode. The display device may further include a third insulating layer between the first electrode of the light-emitting element and the data conductor.

The display device may further include a fourth insulating layer between the second electrode and the third insulating layer. The bending emission layer may be disposed between the fourth insulating layer and the second electrode, and the substrate which is bent at the first bending area may bend the bending emission layer together with the first upper bending portion.

The display device may further include in the first lower bending portion, a first wire and a second wire on the inorganic layer and through which an electrical signal is applied from outside the display device to the first upper bending portion and the flat area for displaying the image, the first wire and the second wire disposed at opposing sides of the first lower bending portion, and a connection wire which electrically connects the first wire to the second wire, the connection wire and the data conductor being respective portions of a same material layer on the substrate.

The substrate which is bent at the first bending area may bend the connection wire together with the first lower bending portion.

The display device may include an encapsulation layer including an inorganic material layer and an organic material layer. In the flat area, the first emission layer may be between the encapsulation layer and the third insulating layer, the encapsulation layer may extend from the flat area to be disposed in the first upper bending portion, and in the first upper bending portion, the bending emission layer may be between the encapsulation layer and the third insulating layer.

According to one or more exemplary embodiment of the display device, by partially removing an inorganic layer in the bending area of the display device to reduce a total thickness of the inorganic layer, stress applied to the bending area may be minimized to reduce or effectively prevent defects such as cracks, wire damage, and the like, thereby improving display quality, stability, etc. of the display device.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
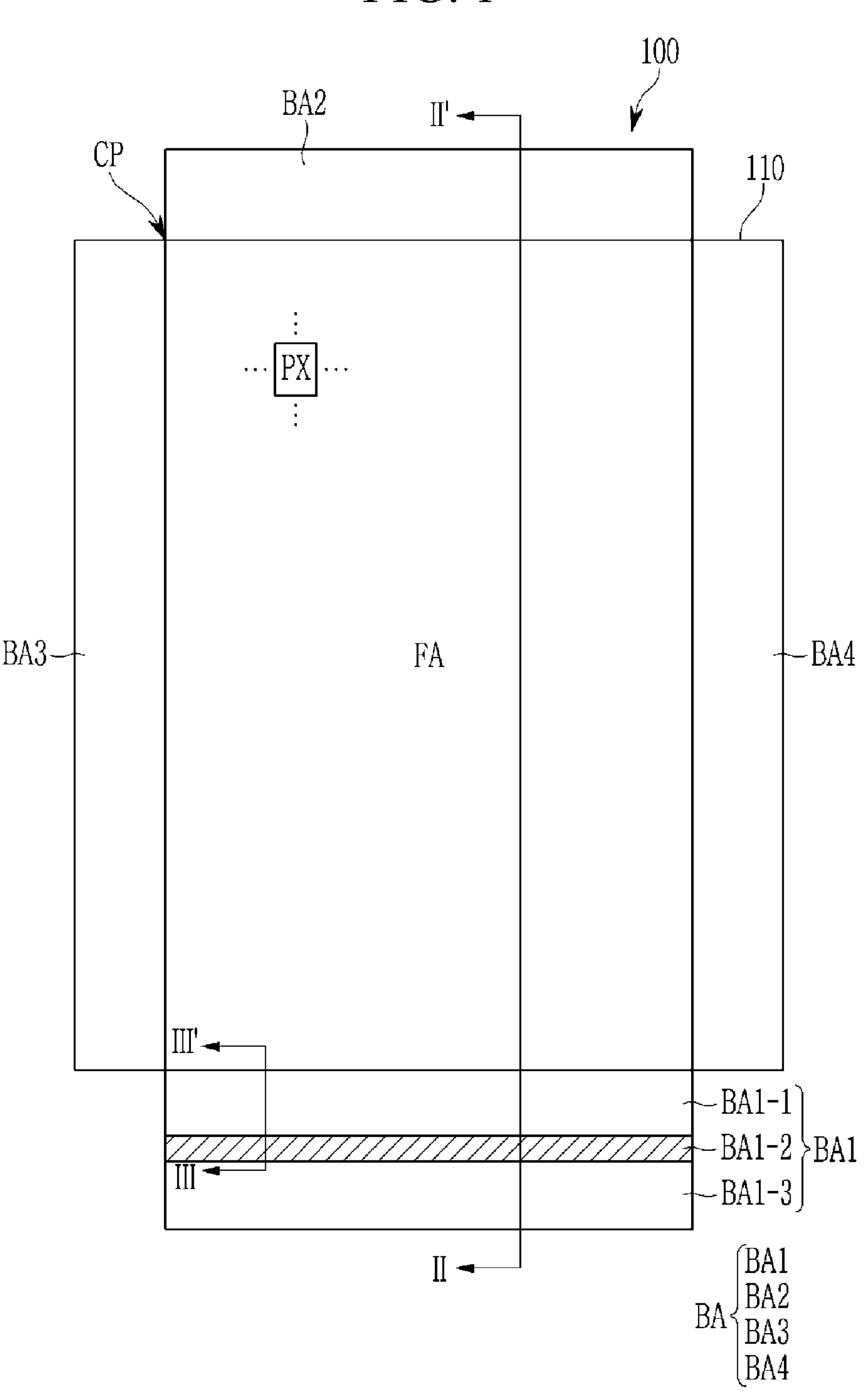
FIG. 1 is a top plan view schematically showing an exemplary embodiment of a display device which is flat.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

For clarity of description of the invention, parts unrelated to the description are omitted, and the same reference numbers will be used throughout this specification to refer to the same or like parts.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

Further, in the specification, the word "on" or "above" means positioned on or below the object portion, and does not necessarily mean positioned on the upper side of the object portion based on a gravitational direction.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. In addition, unless explicitly described to the contrary, the word "comprise" and variations such as "comprises" or "comprising" will be understood to imply the inclusion of stated elements but not the exclusion of any other elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Further, in the specification, the phrase "on a plane" means viewing the object portion from the top, and the phrase "on a cross-section" means viewing a cross-section of which the object portion is vertically cut from the side.

In a process of manufacturing a flexible display device, while bending the display device at a bending area thereof to reduce a non-display area in the manufactured flexible display device, a stress acts on the bending area and/or the display area which is connected to the bending area. The stress may generate defects in the display device and/or a lifetime of the display device may be reduced. Therefore, a flexible display device having improved stress-resistance during bending thereof is being developed.

Figure 2:
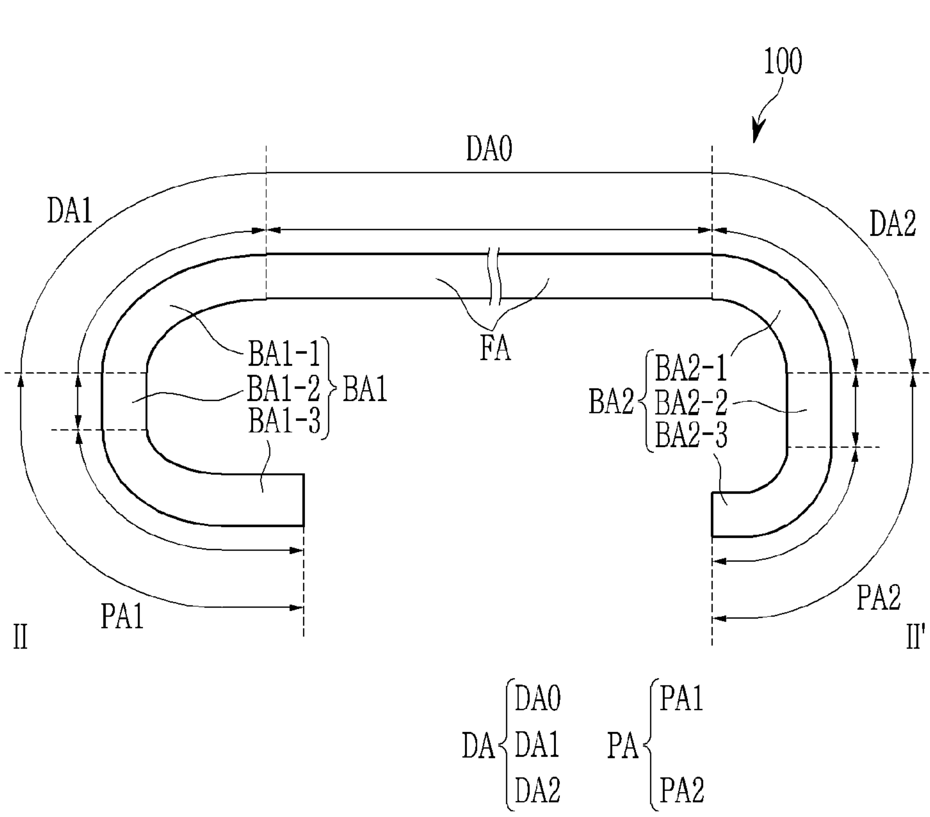
FIG. 2 is a cross-sectional view taken along line II-II' of FIG. 1 showing the display device which is bent.

Hereinafter, an exemplary embodiment of a display device is described with reference to FIG. 1 and FIG. 2. FIG. 1 is a top plan view schematically showing an exemplary embodiment of a display device which is flat, and FIG. 2 is a cross-sectional view taken along line II-II' of an exemplary embodiment of the display device which is bent.

Referring to FIG. 1, a display device 100 which is bendable includes a flat area FA and a bending area BA which is extended from a side of the flat area FA. As shown in FIG. 2, the flat area FA and a portion of the bending area BA may each correspond to a display area DA at which an image is displayed, and another portion of the bending area BA may correspond to a peripheral area PA in which the image is not displayed.

A pixel PX is provided in plurality in the flat area FA. Each pixel PX provided or formed in the flat area FA may be connected to a terminal which is connected to a gate driver, a data driver and/or a printed circuit board ("PCB") (referring to FIG. 7) disposed in the peripheral area PA. The pixel PX may be connected to the gate driver, the data driver and/or the printed circuit board through a signal line (not shown) such as a scan line, a data line, etc. Accordingly, each pixel PX is controlled or driven by a voltage and/or an electrical signal provided through the signal line, to display an image. The pixel PX may receive a voltage or signal such as a scan signal, a data signal, a driving voltage, a common power source, etc., through the signal line, thereby displaying an image. The flat area FA may have a shape of a flat surface.

The flat surface may be disposed in a plane with is parallel to a plane defined by a first direction and a second direction which cross each other. In an exemplary embodiment, the first and second directions may be variously represented by the vertical and horizontal directions of FIG. 1. A thickness of the display device 100 and/or components thereof is taken along a third direction which crosses each of the first and second directions. In an exemplary embodiment, the third direction may be represented by the vertical direction in FIG. 2, while the first and/or second directions may be represented by the horizontal direction in FIG. 2.

Referring to the top plan view of FIG. 1, the bending area BA may be provided or formed adjacent to the flat area FA such as to be around the flat area FA, and may be disposed at each edge of the flat area FA among outer edges thereof. The bending area BA may include a first bending area BA1, a second bending area BA2, a third bending area BA3, and a fourth bending area BA4. The display device 100 may be bendable at each of these areas. Each edge of the flat area FA adjacent to a bending area may be defined by a chamfered shape, and this portion is referred to as a chamfered portion CP.

The first bending area BA1 is disposed at a lower side of the flat area FA, and may include a first upper bending portion BA1-1, a first extending portion BA1-2, and a first lower bending portion BA1-3. The first upper bending portion BA1-1, the first extending portion BA1-2, and the first lower bending portion BA1-3 respectively meet each other at sides adjacent to each other. The substrate 110 which is bent bends the first bending area BA1 at each of the adjacent sides at which the first upper bending portion BA1-1, the first extending portion BA1-2, and the first lower bending portion BA1-3 respectively meet.

The first lower bending portion BA1-3 includes a connection interface such as a pad or a bump to which a printed circuit board ("PCB") (referring to FIG. 7) is attachable an in which circuit parts such as a data driving IC (integrated chip) may be provided or formed. Referring to FIG. 2, the first bending area BA1 is bent along with the connection interface. In an exemplary embodiment, the first bending area BA1 which is bent and has the printed circuit board ("PCB") (referring to FIG. 7) attached thereto, may dispose the printed circuit board on a back surface of the display device 100.

The second bending area BA2 may be disposed at the upper side of the flat area FA. The second bending area BA2 may include a second upper bending portion BA2-1, a second extending portion BA2-2, and a second lower bending portion BA2-3.

The third bending area BA3 may be disposed at the left side of the flat area FA. The third bending area BA3 may include a third upper bending portion (not shown), a third extending portion (not shown), and a third lower bending portion (not shown).

The fourth bending area BA4 may be disposed at the right side of the flat area FA. The fourth bending area BA4 may include a fourth upper bending portion (not shown), a fourth extending portion (not shown), and a fourth lower bending portion (not shown).

The flat area FA may correspond to a main display area DA0. The first and second upper bending portions BA1-1 and BA2-1 may respectively correspond to a first display area DA1 and a second display area DA2 (referring to FIG. 2), which are described later. Although not shown, the third and fourth upper bending portions may respectively correspond to third and fourth display areas, which are described later. As above-described, the display area DA may include a collection of the flat area FA and first to fourth upper bending portions of the first to fourth bending areas BA1, BA2, BA3, and BA4. The first to fourth upper bending portions may each be disposed closer to the flat area FA than the first to fourth lower bending portions, respectively.

The display device 100 bent at the first to fourth bending areas BA1, BA2, BA3, and BA4 may dispose respective portions of the first to fourth bending areas BA1, BA2, BA3, and BA4 bent below the display device 100 with respect to each side of the flat area FA. In detail, for example, the substrate 110 which is bent at the first bending area BA1 disposes the first upper bending portion BA1-1 area overlapping the first lower bending portion BA1-3 along a thickness direction of the display device 100. That is, a flexible display device at the display device 100 in which all edge portions of the substrate 110 are bendable may be realized. As a result, viewing of an image at the flat area FA of the display device 100 may minimize or narrow a peripheral area PA (e.g., area at which an image is not displayed) which is recognizable to outside the display device 100.

The flexible display device at a display device 100 provided with flexibility, and may have the same meaning as a bendable display device, a rollable display device, an unbreakable display device, a foldable display device, etc.

The first extending portion BA1-2 and the first lower bending portion BA1-3 may correspond to a first peripheral area PA1. The second extending portion BA2-2 and the second lower bending portion BA2-3 may correspond to a second peripheral area PA2. Although not shown, the third extending portion and the third lower bending portion of the third bending area BA3 may correspond to a third peripheral area, and the fourth extending portion and the fourth lower bending portion of the fourth bending area BA4 may correspond to a fourth peripheral area.

That is, various driving circuits or wires are disposed in the first to fourth extending portions and the first to fourth lower bending portions which are at the peripheral area PA, such that an image is not displayed at the peripheral area PA and the various driving circuits or wires are not visible from a viewing side of the display device 100. A dam member DM (referring to FIG. 3), which is described later, may be disposed in the first to fourth extending portions.

In FIG. 1, the flat area FA is shown as a quadrangle and the bending area BA is shown as being disposed at each of four sides of the flat area FA, however, the shape of the display area DA and the shape and/or the arrangement of the bending area BA are not limited to the example shown in FIG. 1. In an exemplary embodiment, for example, at bending area may be included only at the lower side of the flat area FA, or at least one bending area among the second, third, and fourth bending areas BA2, BA3, and BA4 may only be included.

Figure 3:
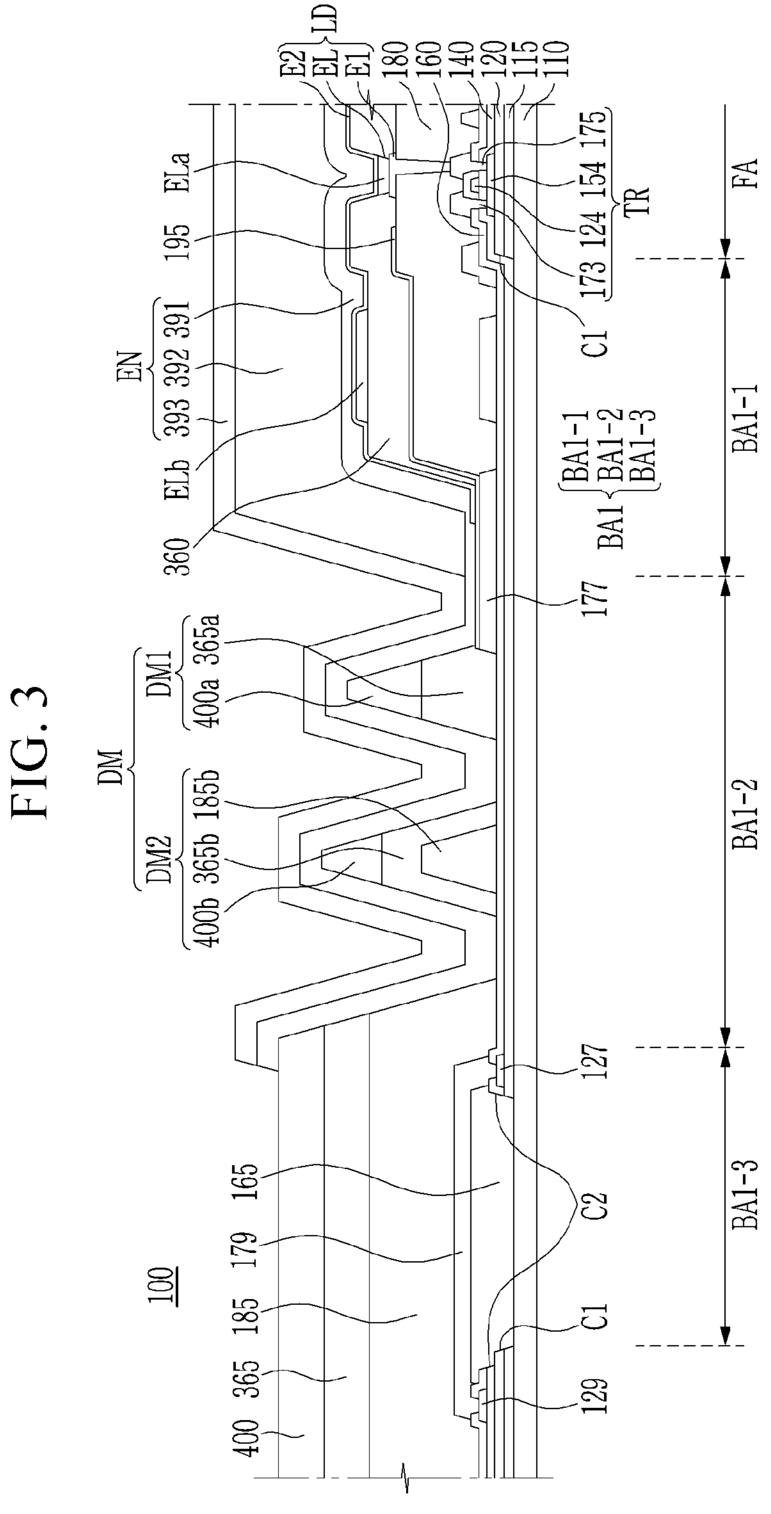
FIG. 3 is an enlarged cross-sectional view taken along line III-III' of FIG. 1.

The display device is further described with reference to FIG. 3. FIG. 3 is an enlarged cross-sectional view taken along line III-III' of FIG. 1. While a structure of the first bending area BA1 is detailed in FIG. 3, it will be understood that a structure of other bending areas which extend from the flat area FA may have the same structure.

In the enlarged cross-sectional view of FIG. 3, the first bending area BA1 is adjacent to the flat area FA, and includes in order from the flat area FA, a first upper bending portion BA1-1, a first extending portion BA1-2, and a first lower bending portion BA1-3. The flat area FA includes a pixel driving member in which a transistor TR is provided or formed, and an organic light-emitting element LD connected thereto. A portion of the organic light-emitting element LD connected to the transistor TR is disposed in the first upper bending portion BA1-1.

Referring to FIG. 3, the display device 100 includes a substrate 110 and several layers, wires, and elements which are provided or formed thereon. The substrate 110 may be common to each of the flat area FA, and the first, second, third, and fourth bending areas BA1, BA2, BA3, and BA4 FIG. 3 may represent a structure of the display device 100 which is flat. The pixel PX provided in plurality as a plurality of pixels PX, are disposed in the display area DA of the display device 100. In an exemplary embodiment, each pixel PX includes a transistor, a capacitor, and a light-generating and emitting element, etc. However, the stacked structure of the display device 100 is described focusing on one transistor TR and the light-emitting element LD connected thereto per each pixel PX.

The substrate 110 may be a flexible substrate. The substrate 110 may include or be made of a polymer such as a polyimide, a polyamide, a polycarbonate, or a polyethylene terephthalate.

A barrier layer 115 for reducing or effectively preventing moisture or the like from penetrating from outside the substrate 110 is disposed on the substrate 110. The barrier layer 115 may include an inorganic material or inorganic insulating material such as a silicon oxide (SiOx), a silicon nitride (SiNx), and the like.

A buffer layer 120 is disposed on the barrier layer 115. The buffer layer 120 may block impurities that may diffuse from the substrate 110 to a semiconductor layer 154 in a process of forming the semiconductor layer 154, and reduce the stress applied to the substrate 110 such as during bending thereof or during manufacturing of the display device 100. The buffer layer 120 may include the inorganic insulating material such as a silicon oxide and a silicon nitride. Here, a sum of thicknesses of the barrier layer 115 and the buffer layer 120 may be about 7,000 angstroms (Å) to about 12,000 Å. In an exemplary embodiment, for example, the sum of thicknesses may be about 9,000 Å.

According to an exemplary embodiment, when the barrier layer 115 and the buffer layer 120 include the organic insulating material, the sum of the thicknesses of the barrier layer 115 and the buffer layer 120 may be about 6 micrometers (μm) to about 10 μm, and for example, about 7.8 μm.

The first upper bending portion BA1-1 among the flat area FA and the first bending area BA1 in FIG. 3 is mainly described.

In each of the barrier layer 115 and the buffer layer 120, at portions thereof corresponding to the first bending area BA1, a first opening C1 is provided or formed so as to expose the substrate 110 from the barrier layer 115 and the buffer layer 120. That is, referring to FIG. 3, the barrier layer 115 and the buffer layer 120 are not provided or formed at the first upper bending portion BA1-1, the first extending portion BA1-2, and the first lower bending portion BA1-3 of the first bending area BA1. As above-described, as portions of the barrier layer 115 and the buffer layer 120, such as defining an inorganic layer, are partially removed in the first bending area BA1, the total thickness of the bending area BA is reduced, thereby reducing the stress applied to the first bending area BA1 and various layers, elements, components, etc. disposed therein. Thus, reducing or effectively preventing a defect such as the crack transmitted to the flat area FA or portions adjacent thereto such as the first bending area BA1, through the first bending area BA1 may improve a quality of the display device 100.

The semiconductor layer 154 of the transistor TR is disposed on the buffer layer 120. The semiconductor layer 154 includes a channel region overlapping a gate electrode 124, and a source region and a drain region disposed at respective opposing sides of the channel region. The semiconductor layer 154 may include a polysilicon, an amorphous silicon, or an oxide semiconductor.

A first insulating layer 140 including an inorganic insulating material such as a silicon oxide and a silicon nitride is disposed on the semiconductor layer 154. The first insulating layer 140 may be referred to as a gate insulating layer.

A gate conductor including a scan line and a gate electrode 124 of the transistor TR is disposed on the first insulating layer 140. The gate conductor may include a metal such as molybdenum (Mo), copper (Cu), aluminum (Al), silver (Ag), chromium (Cr), tantalum (Ta), and titanium (Ti), or a metal alloy thereof.

A second insulating layer 160 is disposed on the first insulating layer 140 and the gate conductor. The second insulating layer 160 may include an inorganic insulating material such as a silicon oxide and a silicon nitride. The second insulating layer 160 may be referred to as an interlayer insulating layer.

Hereinafter, the barrier layer 115, the buffer layer 120, the first insulating layer 140, and the second insulating layer 160 may be referred to together as a continuous inorganic layer.

A second opening C2 is provided or formed in each of the first insulating layer 140 and the second insulating layer 160, corresponding to the first lower bending portion BA1-3 among portions the first bending area BA1. That is, in the first lower bending portion BA1-3, portions of each of the first insulating layer 140 and the second insulating layer 160 are removed while the second opening C2 is provided or formed, so none of the barrier layer 115, the buffer layer 120, the first insulating layer 140, or the second insulating layer 160 may be present at the first lower bending portion BA1-3. That is, the substrate 110 at the second opening C2 is exposed from each of the barrier layer 115, the buffer layer 120, the first insulating layer 140, or the second insulating layer 160. Thus, since the first lower bending portion BA1-3 has no portion of the continuous inorganic layer, the display device 100 may have more flexibility at when the display device 100 is bent to dispose the first bending area BA1 below other portions of the display device 100 (with reference to FIG. 2).

In an exemplary embodiment of manufacturing the display device 100, since the first opening C1 having a larger planar area (e.g., refer to horizontal dimension in FIG. 3) than the second opening C2 is provided or formed before the second opening C2, a total thickness of the continuous inorganic layer may be reduced over an entirety of the first bending area BA. Such a process sequence may be applied to both of a mask process and a mask for manufacturing the display device 100, for example.

A data conductor including a data line, a driving voltage line, a voltage transmitting line, and a source electrode 173 and a drain electrode 175 of the transistor TR, is disposed on the second insulating layer 160. The source electrode 173 and the drain electrode 175 may be respectively connected to the source region and the drain region of the semiconductor layer 154 at or through contact holes provided or formed in the second insulating layer 160 and the first insulating layer 140. A voltage transmitting line 177 may transmit a common voltage. The data conductor includes or is made of the metal such as aluminum (Al), copper (Cu), silver (Ag), gold (Au), platinum (Pt), palladium (Pd), nickel, molybdenum (Mo), tungsten (W), titanium, (Ti), chromium (Cr), tantalum (Ta), and the like, or the metal alloy thereof. The data conductor may be a multilayer such as titanium/aluminum/titanium (Ti/Al/Ti), titanium/copper/titanium (Ti/Cu/Ti), molybdenum/aluminum/titanium (Mo/Al/Mo), and the like.

The gate electrode 124, the source electrode 173, and the drain electrode 175 form the transistor TR along with the semiconductor layer 154. In the transistor TR of FIG. 3, the gate electrode 124 is disposed above the semiconductor layer 154, however, the structure of the transistor TR is not limited thereto, and it may be variously changed.

A third insulating layer 180 is disposed on the second insulating layer 160 and the data conductor. The third insulating layer 180 may include an organic insulating material, and may include, for example a polyimide, an acryl-based polymer, a siloxane polymer, and the like.

A first electrode E1 of the light-emitting element LD is disposed on the third insulating layer 180. The first electrode E1 may be connected to the drain electrode 175 at or through a contact hole provided or formed in the third insulating layer 180. A connecting member 195 connected to the voltage transmitting line 177 is disposed on the third insulating layer 180. For the connection of the connecting member 195 and the voltage transmitting line 177, a portion of the third insulating layer 180 overlapping the voltage transmitting line 177 is removed. The connecting member 195, which is a conductive layer, may be provided or formed of the same material in the same process as the first electrode E1, such as being portions of a same material layer used in manufacturing a display device 100. The first electrode E1 and the connecting member 195 may include or be made of the metal such as silver, nickel, gold, platinum, aluminum, copper, aluminum-neodymium, aluminum-nickel-lanthanum, and the like, or the metal alloy thereof. The first electrode E1 and the connecting member 195 may include a transparent conductive material such as an indium tin oxide ("ITO") and an indium zinc oxide ("IZO"). The first electrode E1 and the connecting member 195 may be a multilayer such as ITO/silver (Ag)/ITO and ITO/aluminum (Al).

A fourth insulating layer 360 having an opening defined therein overlapping the first electrode E1 is disposed on the third insulating layer 180. The opening of the fourth insulating layer 360 defines a pixel area of the pixel PX and may be referred to as a partition. A portion of a material layer from which the fourth insulating layer 360 is provided may be further included in a dam member DM disposed in the first extending portion BA1-2 of the first bending area BA1. The material layer from which the fourth insulating layer 360 and the portion of the dam member DM are provided may include the organic insulating material.

An emission layer EL is disposed on the first electrode E1, and the second electrode E2 is disposed on the emission layer EL. The second electrode E2 is connected with the connecting member 195. Since the connecting member 195 is connected to the voltage transmitting line 177, the second electrode E2 is electrically connected to the voltage transmitting line 177 via the connecting member 195 and may receive the common voltage.

The emission layer EL may include a first emission layer ELa disposed within the opening of the fourth insulating layer 360. The emission layer EL may further include a bending emission layer ELb disposed in the first upper bending portion BA1-1 and disposed on the fourth insulating layer 360. The first emission layer ELa and the bending emission layer ELb may be respective portions of a same material layer used in manufacturing the emission layer EL, without being limited thereto.

In an exemplary embodiment of manufacturing a display device 100, the second electrode E2 is provided or formed by laminating metals in layers have a relatively small thickness (e.g., being thin) and having relatively low work functions such as calcium (Ca), barium (Ba), magnesium (Mg), aluminum (Al), silver (Ag), and the like to have a light transmitting property. The second electrode E2 may be provided or formed from a transparent conductive material such as ITO and IZO. The first electrode E1, the emission layer EL, and the second electrode E2 of each pixel PX form the light-emitting element LD such as an organic light-emitting diode. One of the first electrode E1 and the second electrode E2 becomes a cathode and the other becomes an anode.

The transistor TR including the semiconductor layer 154 is disposed at the flat area FA, such that an entirety of the transistor TR may be included in the flat area FA. However, the light-emitting element LD electrically connected to the transistor TR is disposed at both the flat area FA and the first upper bending portion BA1-1 extending therefrom. According to the above description, among portions of the light-emitting layer EL, the bending emission layer ELb is disposed in the first upper bending portion BA1-1.

The bending emission layer ELb may be bendable with the bending of the first upper bending portion BA1-1, when the display device 100 is bent to dispose a portion of the first bending area BA1 below portions the display device 100. The substrate 110 which is bent at the first bending area BA1 bends the bending emission layer ELb together with the first upper bending portion BA1-1. Accordingly, again referring to FIG. 2, the first display area DA1 in which the image is displayed may also be implemented in the first upper bending portion BA1-1.

Referring to FIG. 1, the bending emission layer ELb disposed at the first upper bending portion BA1-1 and electrically connected to the transistor TR disposed at the flat area FA, may also be disposed at the second, third, and fourth bending areas BA2, BA3, and BA4 which are respectively extended from the upper side, the left side, and the right side of the flat area FA of the display device 100. Accordingly, in the display device 100 according to an exemplary embodiment, the image may also be displayed at each one of a bending area which is bent at a side of the flat area FA, as well as the flat area FA. If all of the first to fourth bending areas BA1, BA2, BA3, and BA4 are present, the display device 100 according to an exemplary embodiment may be a four-surface emissive display device.

An encapsulation layer EN is disposed on the second electrode E2. The encapsulation layer EN seals the light-emitting element LD to reduce or effectively prevent moisture or oxygen from penetrating thereto from outside the display device 100. The encapsulation layer EN may be a stacked structure with at least one inorganic layer and at least one organic layer. In the illustrated embodiment, the encapsulation layer EN is a thin film encapsulation layer including a first inorganic material layer 391, a second inorganic layer 393, and an organic material layer 392 therebetween. The first inorganic material layer 391 and the second inorganic layer 393 covering the side of the organic material layer 392 are extend further than edges or ends of the organic material layer 392, such as to be in contact with each other at an edge region of the encapsulation layer EN. The organic material layer 392 may include an acryl-based resin, a methacrylic-based resin, polyisoprene, a vinyl-based resin, an epoxy-based resin, a urethane-based resin, a cellulosic-based resin, and a perylene-based resin.

A polarization layer (not shown) to reduce reflection of external light incident to the display device 100 may be disposed on the encapsulation layer EN. A touch sensor layer (not shown) including touch electrodes for sensing a touch may be disposed between the encapsulation layer EN and the polarization layer.

Referring to the first extending portion BA1-2, the dam member DM is disposed above the second insulating layer 160, that is, further from the substrate 110 than the second insulating layer 160. The dam member DM may be disposed along an outer edge of the substrate 110, and may include a first dam DM1 and a second dam DM2. The first dam DM1 and the second dam DM2 may be disposed in the first bending area BA1 disposed below the display device 100. The lower layer of the first dam DM1 may be a third protection layer 365*a*, and an upper layer may be a bending protection layer 400*a*. The second dam DM2 may consist of a second protection layer 185*b*, a third protection layer 365*b*, and a bending protection layer 400*b* in order from below. The bending protection layers 400*a* and 400*b* of the dam member DM are also referred to as spacers.

The dam member DM may reduce or effectively prevent the organic materials such as monomers from overflowing when the organic material layer 392 of the encapsulation layer EN is provided or formed during manufacturing of the display device 100. Thus, a terminal end or edge of the organic material layer 392 of the encapsulation layer EN may be disposed inside the dam member DM, that is, between the dam member DM and the display area DA.

The first inorganic material layer 391 and the second inorganic layer 393 of the encapsulation layer EN may be provided or formed to extend further than the first upper bending portion BA1-1 and be disposed over the first dam DM1 and the second dam DM2. As the contact area between the first inorganic layer material 391 and the second inorganic layer 393 increases by following the profile of the first dam DM1 and the second dam DM2, adhesion between the first inorganic material layer 391 and the second inorganic layer 393 may be increased.

A connection wire 179 electrically connecting a first wire 127 and a second wire 129 disposed at opposing sides of the first lower bending portion BA1-3, is provided or formed in the first lower bending portion BA1-3. An electrical signal (e.g., a data signal, a control signal, or a voltage signal) output from the printed circuit board ("PCB") (referring to FIG. 7) and a signal (e.g., a driving voltage or a common voltage) input to a pad of a pad portion (not shown) of the display device 100, may be transmitted to the display area DA, the driving device, etc., through the second wire 129, the connection wire 179, and the first wire 127. That is, a signal or voltage may be provided from outside the display device 100, to the pad at the pad portion thereof, and further to the display area DA, through the second wire 129, the connection wire 179, and the first wire 127.

Since the connection wire 179 is bent when the first lower bending portion BA1-3 is bent, the connection wire 179 may be provided or formed of a metal having good flexibility and Young's modulus. The connection wire 179 may be provided or formed of the same material in the same process as the source electrode 173 and the drain electrode 175, such as being portions of a same material layer used in manufacturing the source electrode 173 and the drain electrode 175. As the flexibility of the connection wire 179 increases, the stress applied thereto when the first lower bending portion BA1-3 is bent is reduced, which may reduce the risk of cracking, degradation, or disconnection of the connection wire 179 during the bending.

In the first lower bending portion BA1-3, a first protection layer 165 is disposed between the substrate 110 and the connection wire 179. The first protection layer 165 may include an organic insulating material such as a polyimide, an acryl-based polymer, and a siloxane-based polymer. The first protection layer 165 may be disposed to fill the first opening C1 provided or formed in the barrier layer 115 and the buffer layer 120 and the second opening C2 provided or formed in the first insulating layer 140 and the second insulating layer 160, corresponding to the first lower bending portion BA1-3. In other words, the substrate 110 exposed by the first opening C1 and the second opening C2 may be covered by the first protection layer 165. As the first opening C1 and the second opening C2 are provided or formed to be covered by the organic insulating material of the first protection layer 165, the first lower bending portion BA1-3 may be flexibly bent to the lower surface of the display device 100 and the stress applied to the first lower bending portion BA1-3 may be reduced or effectively prevented.

A second protection layer 185 and a third protection layer 365 are disposed on the connection wire 179. The second protection layers 185, 185*a* and 185*b* may be provided or formed of the same material in the same process as the third insulating layer 180, such as being portions of a same material layer used in manufacturing the third insulating layer 180. The third protection layers 365, 365*a* and 365*b* may be provided or formed of the same material in the same process as the fourth insulating layer 360, such as being portions of a same material layer used in manufacturing the fourth insulating layer 360.

A bending protection layer 400 to smooth a tensile stress and protect the connection wire 179 is disposed on the third protection layer 365. The bending protection layer 400 may be referred to as a stress neutralization layer. The bending protection layer 400 may include an organic insulating material such as an acryl resin. The bending protection layers 400*a* and 400*b* may be provided or formed of the same material in the same process as the bending protection layer 400, such as being portions of a same material layer used in manufacturing the bending protection layer 400.

In the flexible display device, an inorganic insulating layer is susceptible to cracking during the bending thereof, and may cause damage to a wire disposed thereon such as by the cracks. Therefore, according to one or more of the exemplary embodiments, the barrier layer 115, the buffer layer 120, the first insulating layer 140, and the second insulating layer 160, which together are the continuous inorganic layer including the inorganic insulating material, may be removed in the first lower bending portion BA1-3.

Furthermore, the barrier layer 115 and the buffer layer 120, which are a portion of the continuous inorganic layer, are removed in the first extending portion BA1-2 as well as the first lower bending portion BA1-3 and the first upper bending portion BA1-1. Thus, when the first bending area BA1 is bent, the stress received over the first bending area BA1 is reduced so the display device 100 may be more flexibly bent. In addition, the display quality and stability of the display device may be improved by improving the defects such as the cracks, the degradation, and the disconnections generated in a display device 100.

By disposing the bending emission layer ELb in the first upper bending portion BA1-1 of the first bending area BA1, the image is displayed at a side bending portion of the display device 100 that is bent from a side of the flat area FA of the display device 100. Particularly, as the image may be displayed in the first bending area BA1 disposed at the lower side of the flat area FA, as well as the left and right sides of the flat area FA (e.g., at the third and fourth bending areas BA3 and BA4), there is a merit in that the area of the peripheral area PA where the image is not displayed may be further reduced.

Figure 4:
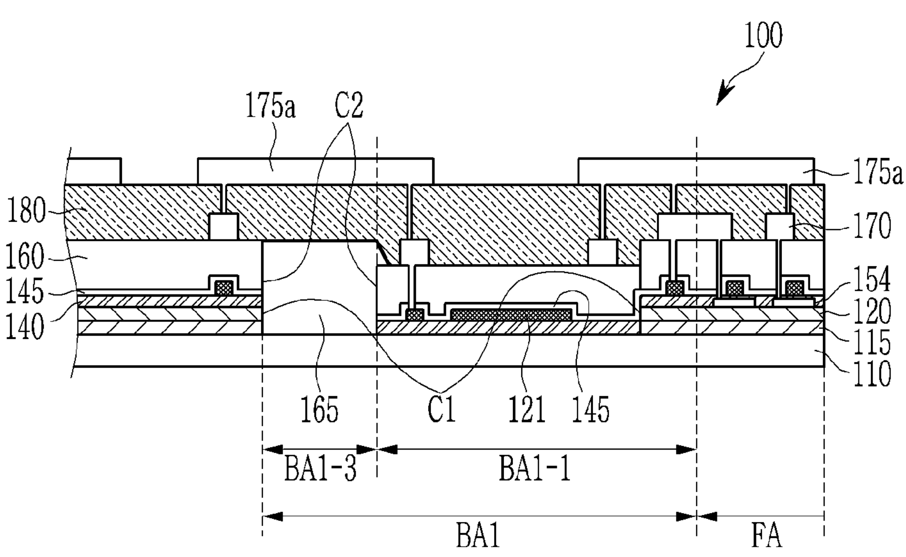
FIG. 4 is an enlarged cross-sectional view of another exemplary embodiment of the display device taken along line III-III' of FIG. 1.

The characteristics of another exemplary embodiment of a display device 100 are described with reference to FIG. 4. FIG. 4 is an enlarged cross-sectional view taken along line III-III' of FIG. 1. Hereinafter, description of portions that are similar to the portions described in FIG. 3 may be omitted, and the characteristic portion is mainly described.

Referring to FIG. 4, the display device 100 may include a substrate 110, a plurality of layers provided or formed on the substrate 110, various wires, and the like. The display device 100 includes a flat area FA and a first bending area BA1 adjacent thereto, and the first bending area BA1 may include a first upper bending portion BA1-1 and a first lower bending portion BA1-3. While the first bending area BA1 of FIG. 4 may include the above-mentioned first extension portion BA1-2, such portion is omitted in FIG. 4 for convenience of explanation.

The barrier layer 115 and the buffer layer 120 are sequentially disposed on the substrate 110 that may be a flexible substrate. In the portion corresponding to the first bending area BA1, the first opening C1 is provided or formed in the barrier layer 115 and the buffer layer 120 so as to expose the substrate 110. That is, at the first opening C1 in the first bending area BA1, the barrier layer 115 and the buffer layer 120 are not disposed. The sum of the thicknesses of the barrier layer 115 and the buffer layer 120 may be about 7,000 Å to about 12,000 Å, for example, about 9,000 Å.

A semiconductor layer 154 is disposed of the buffer layer 120. The semiconductor layer 154 may include the channel region overlapping the gate electrode 124, and the doped source and drain regions disposed on respective opposing sides thereof.

The first insulating layer 140 including the inorganic insulating material is disposed on the semiconductor layer 154. The gate conductor including the scan line and the gate electrode 124 (referring to FIG. 3) of the transistor TR (referring to FIG. 3) is disposed on the first insulating layer 140. In FIG. 4, the gate conductor may further include a data signal transmitting layer 121 in the first upper bending portion BA1-1. The data signal transmitting layer 121 may have a function of transmitting the data signal and the like output from the printed circuit board ("PCB") (referring to FIG. 7) disposed at the first peripheral area PA1 of the first bending area BA1, to the display area DA.

A first-first insulating layer 145 may be disposed on the gate conductor. The first-first insulating layer 145 may be a relatively thin inorganic insulating layer to protect the gate conductor.

The second insulating layer 160 is disposed on the first-first insulating layer 145. The second insulating layer 160 may include the inorganic insulating material and may be referred to as the interlayer insulating layer.

In the first lower bending portion BA1-3, the second opening C2 is provided or formed in each of the first insulating layer 140, the first-first insulating layer 145, and the second insulating layer 160. To provide or form the second opening C2 in the first lower bending portion BA1-3, portions of the first insulating layer 140, the first-first insulating layer 145, and the second insulating layer 160 may be absent. A first protection layer 165 maybe disposed so as to fill the first opening C1 and the second opening C2 provided or formed in the first lower bending portion BA1-3.

A data conductor 170 including the data line, the driving voltage line, the voltage transmitting line, and the source electrode 173 (referring to FIG. 3) and the drain electrode 175 (referring to FIG. 3) of the transistor TR (referring to FIG. 3) is disposed on the second insulating layer 160. The data conductor 170 may configure a portion of the transistor TR (referring to FIG. 3) in the flat area FA and the first upper bending portion BA1-1 by being electrically connected to the gate conductor thereunder.

The third insulating layer 180 is disposed on the second insulating layer 160 and the data conductor 170. The third insulating layer 180 may include the organic insulating material.

An upper connection wire 175*a* may be disposed on the third insulating layer 180. The third insulating layer 180 includes the opening so that the upper connection wire 175*a* may be electrically connected to the underlying data conductor 170. Here, the upper connection wire 175*a* disposed in the flat area FA and extended into the first upper bending portion BA1-1 may correspond to the first electrode E1 (referring to FIG. 3) of the light-emitting element LD (referring to FIG. 3). In other words, the bending emission layer ELb (referring to FIG. 3) and the second electrode (referring to FIG. 3) are disposed on the upper connection wire 175*a*. Accordingly, where the first bending area BA1 is bent to be disposed at a lower portion of the display device 100, the image may be displayed at the first upper bending portion BA1-1 with the bending emission layer ELb.

According to one or more exemplary embodiment, as the display device 100 excludes the continuous inorganic layer from the first bending area BA1, and particularly excludes the barrier layer 115 and the buffer layer 120 in the first upper bending portion BA1-1 closest to the flat area FA of the display device 100, the thickness of the continuous inorganic layer in the first bending area BA1 may be reduced considerably. Accordingly, reducing or effectively preventing defects such as the crack, wire damage, disconnection, and degradation generated in the display device 100 is possible by smoothing the stress and impact received when the display device 100 being flexible is bent at the bending area BA.

Figure 5:
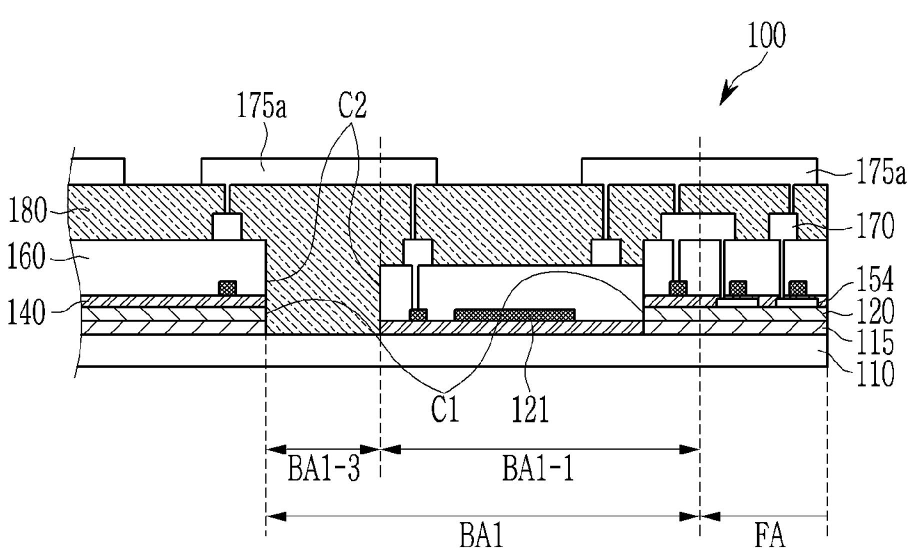
FIG. 5 is an enlarged cross-sectional view of still another exemplary embodiment of the display device taken along line III-III' of FIG. 1.

The characteristics of still another exemplary embodiment of the display device is described with reference to FIG. 5. FIG. 5 is an enlarged cross-sectional view taken along line III-III' of FIG. 1. Hereinafter, different portions from the above-described exemplary embodiment of FIG. 4 are mainly described.

Referring to FIG. 5, the display device 100 may include the substrate 110, the barrier layer 115, the buffer layer 120, the semiconductor layer 154, the first insulating layer 140, the gate conductor, the second insulating layer 160, the data conductor 170, the third insulating layer 180, the upper connection wire 175*a*, etc.

The second insulating layer 160 is directly disposed on the gate conductor without the first-first insulating layer 145 therebetween (referring to FIG. 4). The first opening C1 and the second opening C2 provided or formed at the first lower bending portion BA1-3 may be filled with the third insulating layer 180, instead of the first protection layer 165 (referring to FIG. 4).

Figure 6:
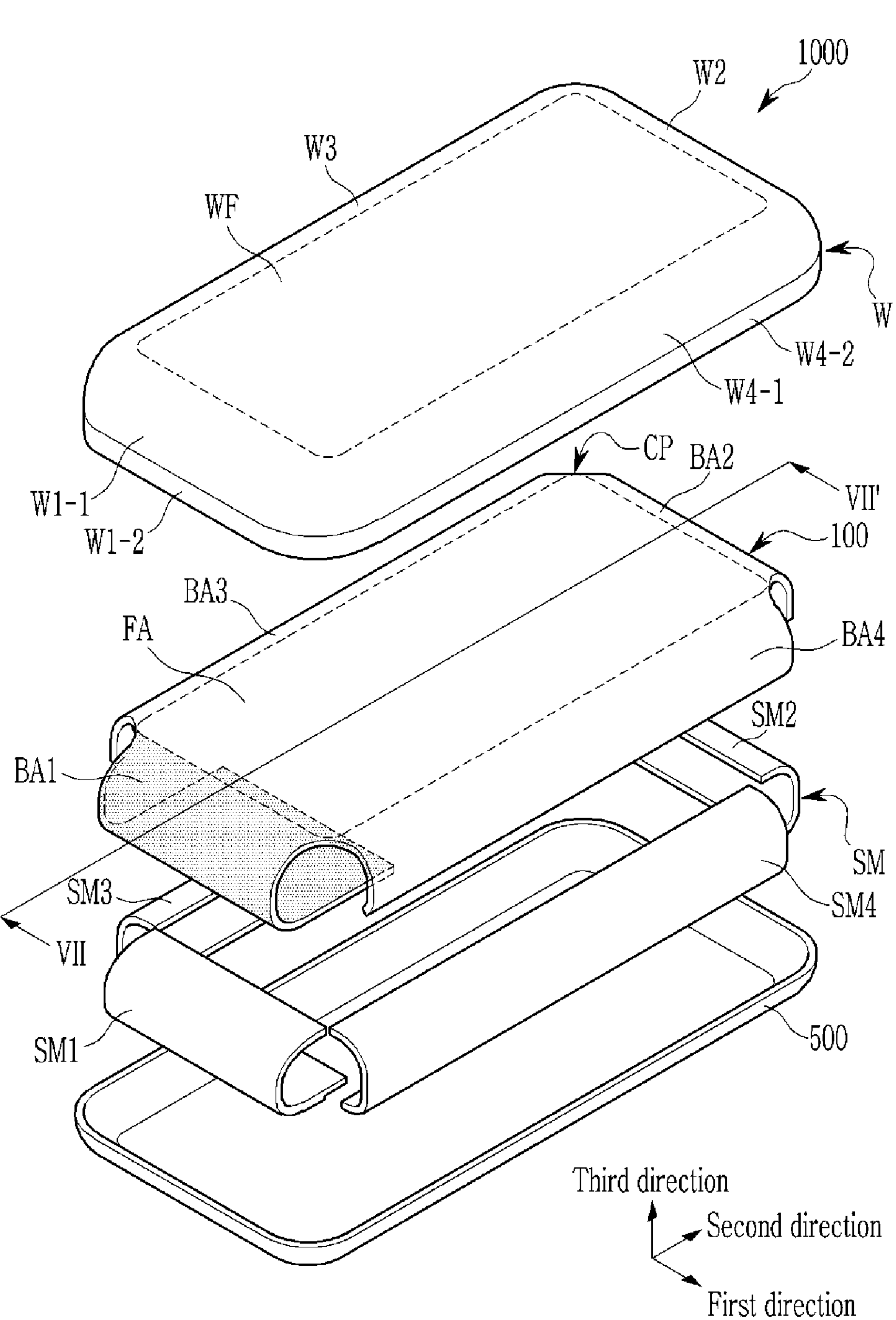
FIG. 6 is an exploded perspective view schematically showing an exemplary embodiment of a display apparatus.

Another exemplary embodiment of the display device is described with reference to FIG. 6 and FIG. 7. FIG. 6 is an exploded perspective view schematically showing another exemplary embodiment of a display apparatus 1000, and FIG. 7 is a cross-sectional view taken along line VII-VII' of FIG. 6.

Figure 7:
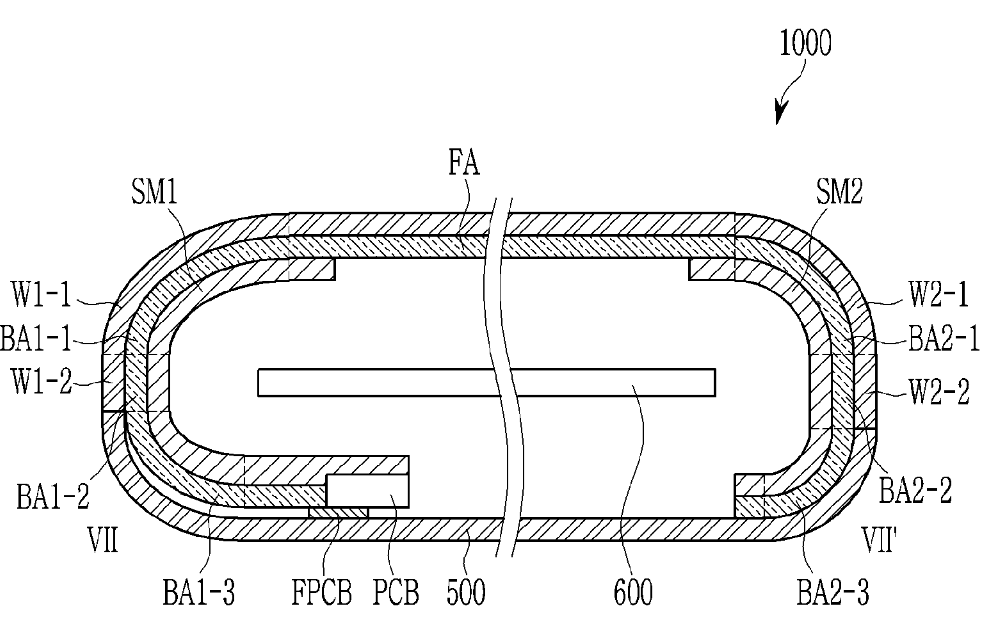
FIG. 7 is a cross-sectional view taken along line VII-VII' of FIG. 6.
Figure 7:
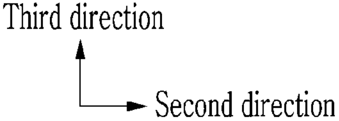

Referring to FIG. 7 along with FIG. 6, a display apparatus 1000 includes a window member W, a supporting member SM, and a rear case 500. The window member W and/or the rear case 500 may form an outer surface of the display apparatus 1000, without being limited thereto.

The window member W may be disposed on the upper portion of the display device 100, and may have a shape that is partially bent to correspond to the shape of the display device 100. The upper surface WF of the window member W may correspond to the flat area FA of the display device 100. The window member W may include be made of a transparent material such as glass, sapphire, or plastic.

The window member W may include or define the upper surface WF, and first to fourth window bending portions. The upper surface WF of the window and the first to fourth window bending portions may not be physically separated (e.g., may be integral with each other), however, are described separately for convenience in the present exemplary embodiment.

The upper surface WF of the window member W is parallel to a plane defined by a First direction and a Second direction crossing each other, and may have a flat shape. In a view along a Third direction, the upper surface WF of the window member W may be defined as a square shape of which the edge (e.g., at a corner) is chamfered with a curved line, without being limited thereto.

The first to fourth window bending portions respectively extend from corresponding first to fourth sides of the upper surface WF, and may have a curved shape based on the four sides of the upper surface WF of the window. The first to fourth window bending portions may be bent along a direction from the upper surface WF of the window member W toward a distal end or edge of the window member W.

The first window bending portion may include a first window upper bending portion W1-1 and a first window extending portion W1-2. The second window bending portion W2 may include a second window upper bending portion W2-1 and a second window extending portion W2-2. Although not shown, the third window bending portions W3 may include a third window upper bending portion and a third window extending portion. The fourth window bending portion may include a fourth window upper bending portion W4-1 and a fourth window extending portion W4-2.

The first to fourth window bending portions may have a shape corresponding to a shape of the first to fourth bending areas BA1, BA2, BA3, and BA4 of the display device 100, respectively.

The display device 100 is the same as the display device 100 shown in FIG. 1 and FIG. 2, so a detailed description is omitted. The display apparatus 1000 according to FIG. 7 includes a flexible printed circuit board FPCB and a printed circuit board PCB.

The flexible printed circuit board FPCB has a flexible characteristic, and may electrically connect the display device 100 and the printed circuit board PCB to each other. The flexible printed circuit board FPCB and the printed circuit board PCB may be disposed at a distal end of the first lower bending portion BA1-3 of the first bending area BA1. Through the flexible printed circuit board FPCB, the printed circuit board PCB may output an electrical signal to the display device 100 and receive an electric signal from the display device 100.

The display device 100 which is bent may be disposed below the window member W. As described above, the pixel PX is provided or formed in the display device 100 to display the image. The display device 100 may be an organic light-emitting display including the organic light-emitting element LD.

The display device 100 may include the flat area FA, and the first to fourth bending areas BA1, BA2, BA3, and BA4. The flat area FA is disposed in a plane which is parallel to a plane defined by the First direction and the Second direction, and may have a flat shape. The flat area FA corresponds to the upper surface WF of the window member W.

The chamfered portion CP may exist between adjacent ones of the bending areas BA1, BA2, BA3, and BA4 so that the first to fourth bending areas BA1, BA2, BA3, and BA4 respectively disposed along four sides of the flat area FA may be easily bent relative to the flat area FA.

The first to fourth upper bending portions (BA1-1, BA2-1, not shown, and not shown; referring to FIG. 2) respectively extend from four sides of the flat area FA and may have a shape that is bent in a direction away from the flat area FA from each of the four sides of the flat area FA.

Although not shown, a touch screen panel may be further disposed between the window member W and the display device 100. The touch screen panel may include a touch region, which is a region for sensing a touch from outside the display apparatus 1000 and/or the touch screen panel, and a touch bezel region, which is disposed around the touch region. A plurality of touch cells may be provided or formed in the touch region. The touch cell as a unit capable of sensing the outside touch, includes at least one touch electrode and senses the touch from the outside by various methods such as a mutual capacitive type or a self-capacitive type to output a touch output signal to the display device 100 or other components of the display apparatus 1000.

The supporting member SM may be disposed on the back of the display device 100. The supporting member SM may include first to fourth supporting members SM1, SM2, SM3 and SM4. The first to fourth supporting members SM1, SM2, SM3 and SM4 may be disposed corresponding to the first to fourth bending areas BA1, BA2, BA3, and BA4 disposed at four sides of the display device 100, respectively.

The supporting member SM is disposed corresponding to the bending area BA of the display device 100, thereby supporting the bending area BA of the display device 100 and improving mechanical strength of the display device 100. Also, by the supporting member SM, the peripheral area PA of the display device 100 is disposed at the position that does not overlap the window member W, and the bending area BA of the display device 100 displaying the image is disposed at the position overlapping the window member W, thereby reducing the peripheral area PA as the region where the image is not displayed in the display apparatus 1000 (e.g., a non-display area).

The rear case 500 may be coupled with the window member W so as to receive the display device 100 and the supporting member SM therebetween. The rear case 500 may include a plastic or metal.

The display apparatus 1000 according to an exemplary embodiment may further include an electronic component 600. The electronic component 600 may be disposed in a space between the display device 100 and the supporting member SM. The electronic component 600 may be components for operating the display apparatus 1000, for example, a battery, various sensors, and the like.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

What is claimed is:

1. A display device comprising:

a substrate including:

a flat area at which an image is displayable, and a bending area at which an image is displayable and at which the display device is bendable, the bending area extended from a side of the flat area and including in order in a direction away from the flat area, a first upper bending portion, a first extending portion, and a first lower bending portion, a transistor disposed in the flat area, a light-emitting element electrically connected to the transistor, the light-emitting element including an emission layer in the flat area and in the first upper bending portion and with which an image is displayable in both the flat area and the first upper bending portion, and inorganic layers disposed in the flat area and the bending area, the inorganic layers including:

a buffer layer on the substrate, a barrier layer between the substrate and the buffer layer, a first insulating layer on the buffer layer, and a second insulating layer disposed further from the substrate than the first insulating layer is from the substrate, wherein each of the first insulating layer, the second insulating layer, the buffer layer and the barrier layer includes an inorganic material, the barrier layer and the buffer layer are excluded from the bending area, the first insulating layer and the second insulating layer are continuously extended from the flat area and into the first upper bending portion and the first extending portion of the bending area, the first insulating layer and the second insulating layer are excluded from the first lower bending portion of the bending area, and a total thickness of the inorganic layers disposed in each of the first upper bending portion, the first extending portion and the first lower bending portion of the bending area is smaller than a total thickness of the inorganic layers disposed in the flat area.

2. The display device of claim 1, wherein the flat area includes each of the first insulating layer, the second insulating layer, the barrier layer and the buffer layer, on the substrate, and each of the first insulating layer and the second insulating layer in the flat area extends from the flat area to be disposed in the first lower bending portion.

3. The display device of claim 1, wherein the transistor includes a semiconductor layer, a gate electrode on the semiconductor layer, a source electrode electrically connected to the semiconductor layer, and a drain electrode electrically connected to the semiconductor layer.

4. The display device of claim 3, wherein a gate conductor includes the gate electrode, a data conductor includes the source electrode and the drain electrode, and in order from the substrate are disposed the buffer layer, the semiconductor layer, the first insulating layer, the gate conductor, the second insulating layer and the data conductor.

5. The display device of claim 4, wherein the emission layer comprises:

a first emission layer in the flat area and with which the image is displayed in the flat area, and a bending emission layer in the first upper bending portion and with which the image is displayed in the first upper bending portion, and the light-emitting element comprises:

a first electrode and a second electrode facing each other, and the first emission layer between the first electrode and the second electrode, further comprising a third insulating layer between the first electrode of the light-emitting element and the data conductor.

6. The display device of claim 5, further comprising a fourth insulating layer between the second electrode and the third insulating layer, wherein the bending emission layer is between the fourth insulating layer and the second electrode, and the substrate which is bent at the bending area bends the bending emission layer together with the first upper bending portion.

7. The display device of claim 5, further comprising an encapsulation layer including an inorganic material layer and an organic material layer, wherein in the flat area, the first emission layer is between the encapsulation layer and the third insulating layer, the encapsulation layer extends from the flat area to be disposed in the first upper bending portion, and in the first upper bending portion, the bending emission layer is between the encapsulation layer and the third insulating layer.

8. The display device of claim 4, further comprising in the first lower bending portion, a first wire and a second wire on the inorganic layers and through which an electrical signal is applied from outside the display device to the first upper bending portion and the flat area for displaying the image, the first wire and the second wire disposed at opposing sides of the first lower bending portion, and a connection wire which electrically connects the first wire to the second wire, the connection wire and the data conductor being respective portions of a same material layer on the substrate.

9. The display device of claim 8, wherein the substrate which is bent at the bending area bends the connection wire together with the first lower bending portion.

10. The display device of claim 1, wherein in the bending area:

the barrier layer and the buffer layer of the inorganic layers include a first opening defined therein, and the first insulating layer or the second insulating layer extending across the first opening.

11. The display device of claim 10, wherein in the first lower bending portion, the first insulating layer and the second insulating layer of the inorganic layers include a second opening which is defined therein and aligned with the first opening.

12. The display device of claim 11, further comprising in the first lower bending portion, a protection layer including an organic material, wherein the protection layer extends into the first opening and the second opening which are aligned with each other at the first lower bending portion to fill the first opening and the second opening.

13. The display device of claim 1, wherein the emission layer comprises:

a first emission layer in the flat area and with which the image is displayed in the flat area, a bending emission layer in the first upper bending portion and with which the image is displayed in the first upper bending portion, and the substrate which is bent at the bending area bends the bending emission layer together with the first upper bending portion.

14. The display device of claim 1, wherein a sum of thicknesses of the barrier layer and the buffer layer is in a range of about 7,000 angstroms to about 12,000 angstroms.

15. The display device of claim 1, wherein the bending area and the flat area meet each other at a side of the flat area, and the substrate which is bent includes the bending area disposed under the flat area.

16. The display device of claim 1, wherein the first upper bending portion, the first extending portion, and the first lower bending portion disposed in order in the direction away from the flat area respectively meet each other at sides adjacent to each other, and the substrate which is bent bends the bending area at each of the adjacent sides at which the first upper bending portion, the first extending portion and the first lower bending portion respectively meet.

17. The display device of claim 1, further comprising the bending area provided in plural including:

a first bending area extended from a first side of the flat area, a second bending area extended from a second side of the flat area opposite to the first side thereof and at which the display device is bendable, a third bending area extended from a third side of the flat area and at which the display device is bendable, or a fourth bending area extended from a fourth side of the flat area opposite to the third side thereof and at which the display device is bendable.

18. The display device of claim 17, wherein the substrate which is respectively bent at the first bending area, the second bending area, the third bending area or the fourth bending area disposes the first bending area, the second bending area, the third bending area or the fourth bending area under the flat area.

19. The display device of claim 17, wherein the emission layer comprises:

a first emission layer in the flat area and with which the image is displayed in the flat area, and a bending emission layer in the first bending area, the second bending area, the third bending area and the fourth bending area and with which the image is respectively displayed in the first bending area, the second bending area, the third bending area, and the fourth bending area, and the substrate which is respectively bent at the first bending area, the second bending area, the third bending area or the fourth bending area bends the respective bending emission layer.

20. An electronic apparatus comprising:

a display device comprising:

a substrate including:

a flat area at which an image is displayable, and a bending area at which an image is displayable and at which the display device is bendable, the bending area extended from a side of the flat area and including in order in a direction away from the flat area, a first upper bending portion, a first extending portion, and a first lower bending portion, a transistor disposed in the flat area, a light-emitting element electrically connected to the transistor, the light-emitting element including an emission layer in the flat area and in the first upper bending portion and with which an image is displayable in both the flat area and the first upper bending portion, and inorganic layers disposed in the flat area and the bending area, the inorganic layers including:

a buffer layer on the substrate, a barrier layer between the substrate and the buffer layer, a first insulating layer on the buffer layer, and a second insulating layer disposed further from the substrate than the first insulating layer is from the substrate; and an electronic component which is adjacent to the display device, wherein wherein each of the first insulating layer, the second insulating layer, the buffer layer and the barrier layer includes an inorganic material, an opening is defined in the barrier layer and the buffer layer, the opening corresponding to the bending area, the first insulating layer and the second insulating layer extending across the opening of the barrier layer and the buffer layer and continuously extended from the flat area and into the first upper bending portion and the first extending portion of the bending area, the first insulating layer and the second insulating layer are excluded from the first lower bending portion of the bending area, and a thickness of the inorganic layers disposed in each of the first upper bending portion, the first extending portion and the first lower bending portion of the bending area is smaller than a thickness of the inorganic layers disposed in the flat area.

* * * * *